United States Patent [19]

Franaszek et al.

[11] Patent Number: 5,729,228
[45] Date of Patent: Mar. 17, 1998

[54] PARALLEL COMPRESSION AND DECOMPRESSION USING A COOPERATIVE DICTIONARY

[75] Inventors: Peter Anthony Franaszek, Mt. Kisco; John Timothy Robinson, Yorktown Heights; Joy Aloysius Thomas, White Plains, all of N.Y.

[73] Assignee: International Business Machines Corp., Armonk, N.Y.

[21] Appl. No.: 498,948

[22] Filed: Jul. 6, 1995

[51] Int. Cl.⁶ ........................................ H03M 7/00
[52] U.S. Cl. .............................. 341/106; 341/51; 341/61; 341/65
[58] Field of Search ............................... 341/106, 51, 61, 341/64, 65, 67, 81, 87

[56] References Cited

U.S. PATENT DOCUMENTS

5,267,051  11/1993  Dellert et al. .
5,293,434  3/1994   Feig et al. .
5,412,429  5/1995   Glover .
5,526,363  6/1996   Weiss et al. .
5,561,421  10/1996  Smith et al. .

*Primary Examiner*—Jeffrey A. Gaffin
*Assistant Examiner*—Jason L W Kost
*Attorney, Agent, or Firm*—Scully, Scott, Murphy & Presser

[57] ABSTRACT

A method and apparatus for compressing a block of data using a shared dictionary. Data to be compressed is divided into subblocks which are each provided to a respective compressor in a plurality of compressors. The compressors cooperatively construct a dynamic compression dictionary and compress the subblocks in parallel using the dictionary. Compressed subblocks output by the compressors are concatenated to form a compressed block.

22 Claims, 11 Drawing Sheets

PARALLEL COMPRESSION AND DECOMPRESSION USING A COOPERATIVE DICTIONARY

BACKGROUND OF THE INVENTION

1. Field of the Invention

This invention relates to data compression systems and methods.

2. Related Art

In applications such as high speed communication over a network or compression of main memory, it may be desirable to compress small blocks of data with very low latency and good compression performance. For example, a system may use blocks of a few hundred bytes and each block may be compressed independently of the other blocks so as to allow access in random order. Traditional sequential compression schemes such Lempel-Ziv coding may not be fast enough for the speeds needed for the above-described applications. Huffman coding can be done very fast but may not provide adequate compression. Like traditional Lempel-Ziv coding, arithmetic coding may be too slow.

The most common approach to fast data compression is based on variations of the first Lempel-Ziv algorithm, also known as LZ77 or LZ1. In this algorithm, the data is scanned sequentially, and at any point, the dictionary used for compression consists of the sequence seen so far. The compressor looks at the next few bytes and finds the longest match within the sequence seen so far. This match constitutes a phrase, and is represented by a pointer back to the beginning of the match and the length of the match. If no match is found, the character is sent as is (in unencoded form) along with a flag bit. The decompressor builds the same dictionary as it proceeds, and reconstructs the phrases from the (pointer, length) pairs.

An approach to make Lempel-Ziv coding to run faster is to introduce parallelism. An original block can be divided into subblocks, and separate Lempel-Ziv compression algorithms can be run on each subblock. For example, if one starts with a 512 byte block and divides it into 4 subblocks, each subblock is only 128 bytes. The dictionary size corresponding to this subblock size is, however, typically too small for good compression and the compression performance of this scheme may be significantly worse than the sequential version.

SUMMARY OF THE INVENTION

The present invention alleviates the above-described problem with dictionary type coding by introducing cooperation among the compressors. Thus there is provided a method and apparatus for compressing a block of data using a shared and cooperatively constructed dictionary. Data to be compressed is divided into sub-blocks which are each provided to a respective compressor in a plurality of compressors. The compressors cooperatively construct a dynamic compression dictionary and compress the sub-blocks in parallel using this dictionary. The outputs of the compressors are concatenated to form a compressed block.

Advantageously, because the dictionary is shared the effective size of the dictionary can be, on the average, half the size of the block, rather than half the size of the sub-block as it would be for independent parallel dictionaries.

DETAILED DESCRIPTION OF THE PREFERRED EMBODIMENT

Figure 1:
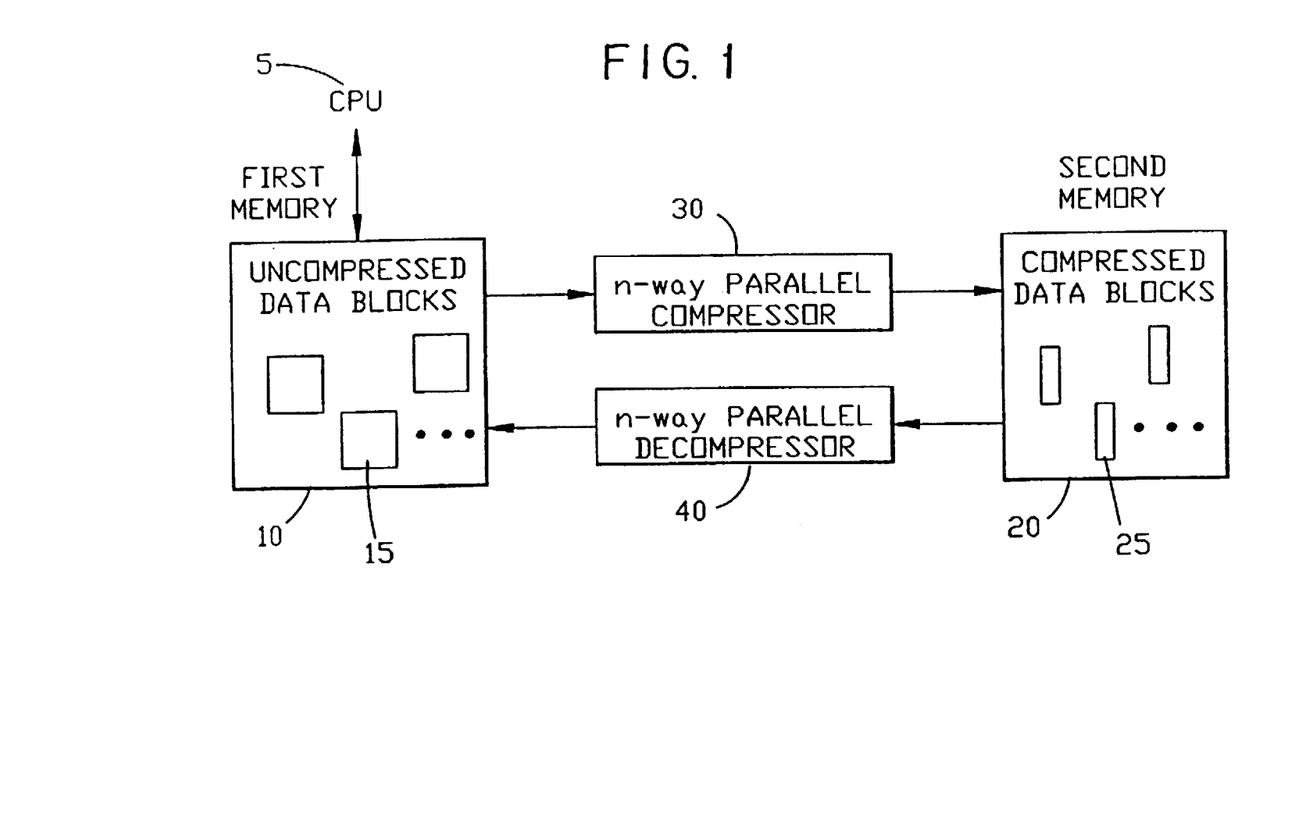
FIG. 1 shows an example of a system structure suitable for use with the current invention.

FIG. 1 shows an example of a system structure suitable for use with the current invention. A CPU 5 accesses a first memory 10 containing uncompressed data blocks 15. Blocks are transferred between the first memory 10 and a second memory 20, where the second memory could be at a lower level in the memory hierarchy, for example semiconductor RAM, disk storage, etc. To increase the number of blocks that can be stored in the second memory given a fixed second memory size, the blocks 25 are stored in compressed format in the second memory. For this purpose there is an n-way parallel compressor 30 to compress blocks when they are stored in the second memory, and an n-way parallel decompressor 40 to decompress blocks when they are stored in the first memory. The compressor and decompressor operate in a parallel fashion, as will subsequently be described, in order to satisfy inter-memory bandwidth requirements. In general, for higher degrees of parallelism, bandwidth is increased, thus in practice the degree of parallelism n will be chosen so as to satisfy the requirements of a particular system.

Figure 2:
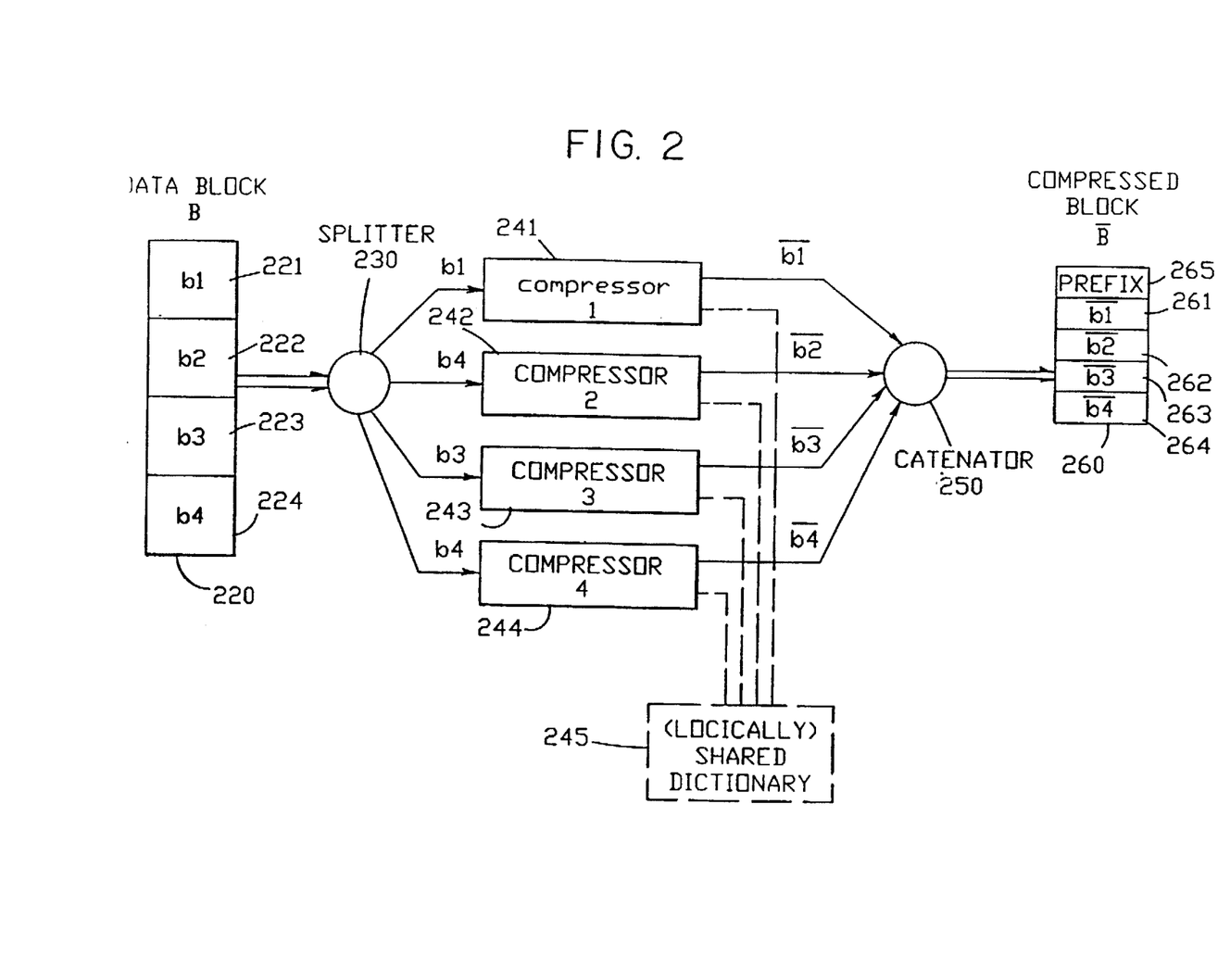
FIG. 2 illustrates how an uncompressed block is compressed using n-way parallel compression.

FIG. 2 illustrates how an uncompressed block B (220) is compressed using n-way parallel compression, where for concreteness the case n=4 is shown. Block B is logically divided into four equal size components, referred to as sub-blocks, b1 (221), b2 (222), b3 (223) and b4 (224). The 4-way parallel compressor includes four distinct compressors 241, 242, 243, and 244. A splitter 230 routes data from sub-block b1 to compressor 1, from sub-block b2 to compressor 2, etc. The output of compressor 1 is logically a compressed sub-block $\overline{b1}$, the output of compressor 2 is logically a compressed sub-block $\overline{b2}$, etc.

Because the degree of compression is variable, depending on the data, each compressed sub-block will in general be a different size. A catenator 250 constructs the compressed block $\overline{B}$ by first constructing a prefix area 265 which gives the starting point of each compressed sub-block in $\overline{B}$, as determined by their compressed lengths, and then appending each compressed sub-block 261, 262, 263, 264.

The problem of poor compression due to small dictionary sizes is avoided by means of a logically shared dictionary 245, which is used by all individual compressors, resulting in an average dictionary size the same as that which would have been obtained if the input had not been split into n sub-blocks. Due to the use of a logically shared dictionary, encoded data produced at a given point in time by compressor 241, for example, can point not only to previous data in sub-block b1, but also to data that has previously been encoded at the given point in time in sub-blocks b2, b3, and b4; and similarly for the other compressors 242, 243, and 244.

The logically shared dictionary can actually be a physically shared memory or can be embodied as n replicated dictionaries. This latter approach is preferred where the compressors are implemented using special purpose hardware and is used in the preferred embodiment as subsequently described.

Figure 3:
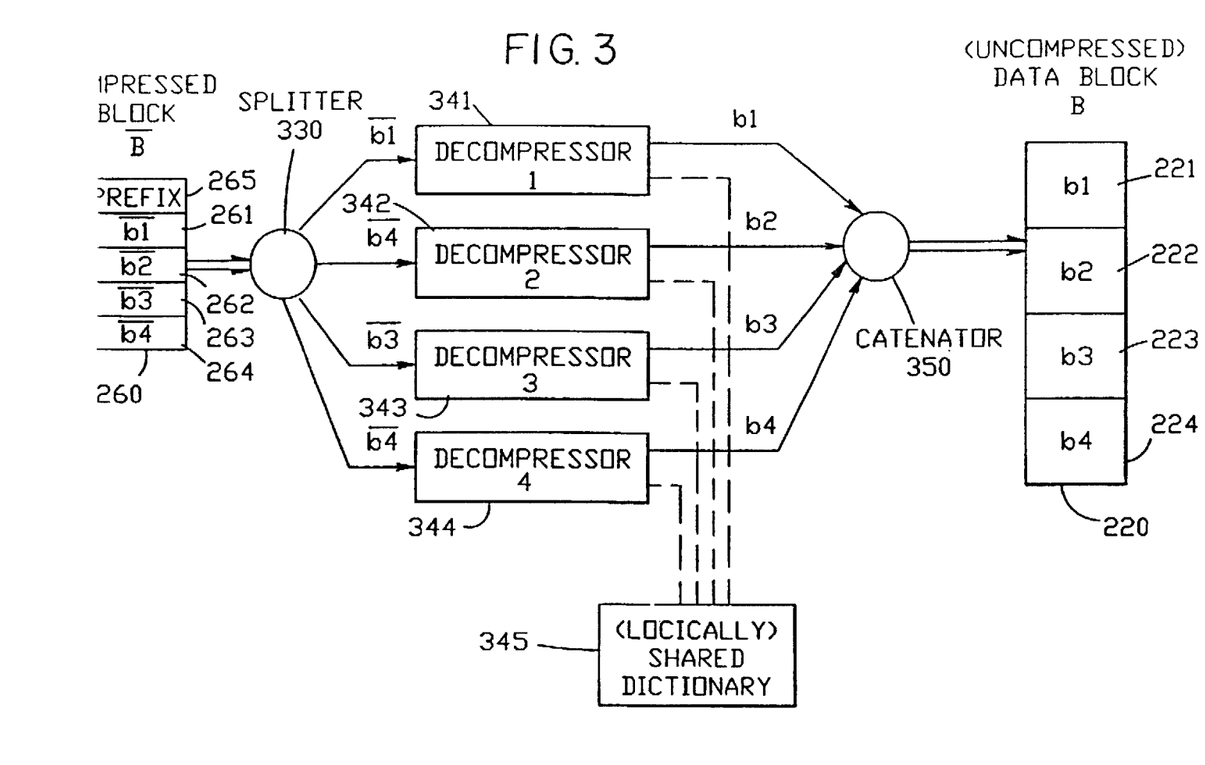
FIG. 3 illustrates how a previously compressed block is decompressed using n-way parallel de-compression.

FIG. 3 illustrates how a previously compressed block $\bar{B}$ 260 is decompressed using n-way parallel decompression, where again for concreteness the case n=4 is shown. The prefix area 265 was previously constructed so as to give the beginning locations of each compressed sub-block $\bar{b1}$ 261, $\bar{b2}$ 262, $\bar{b3}$ 263, and $\bar{b4}$ 264. A splitter (decompression splitter) 330 uses the prefix area so as to route compressed data from $\bar{b2}$ to the first decompressor 341, from $\bar{b2}$ to the second decompressor 342, and similarly for decompressors 343 and 344. Since the compressed sub-blocks were encoded using a logically shared dictionary, a logically shared dictionary 345 is required for de-compression.

As in the case of the parallel compressor, the logically shared dictionary can be implemented as a physically shared memory, or (in the preferred embodiment) as n replicated dictionaries. The output of each de-compressor is an uncompressed sub-block b1, b2, b3, and b4. Since these were of equal size before compression, they are of equal size after de-compression. A catenator 350 appends each sub-block b1 221, b2 222, b3 223, and b4 224 in order to form the uncompressed block B 220.

Figure 4:
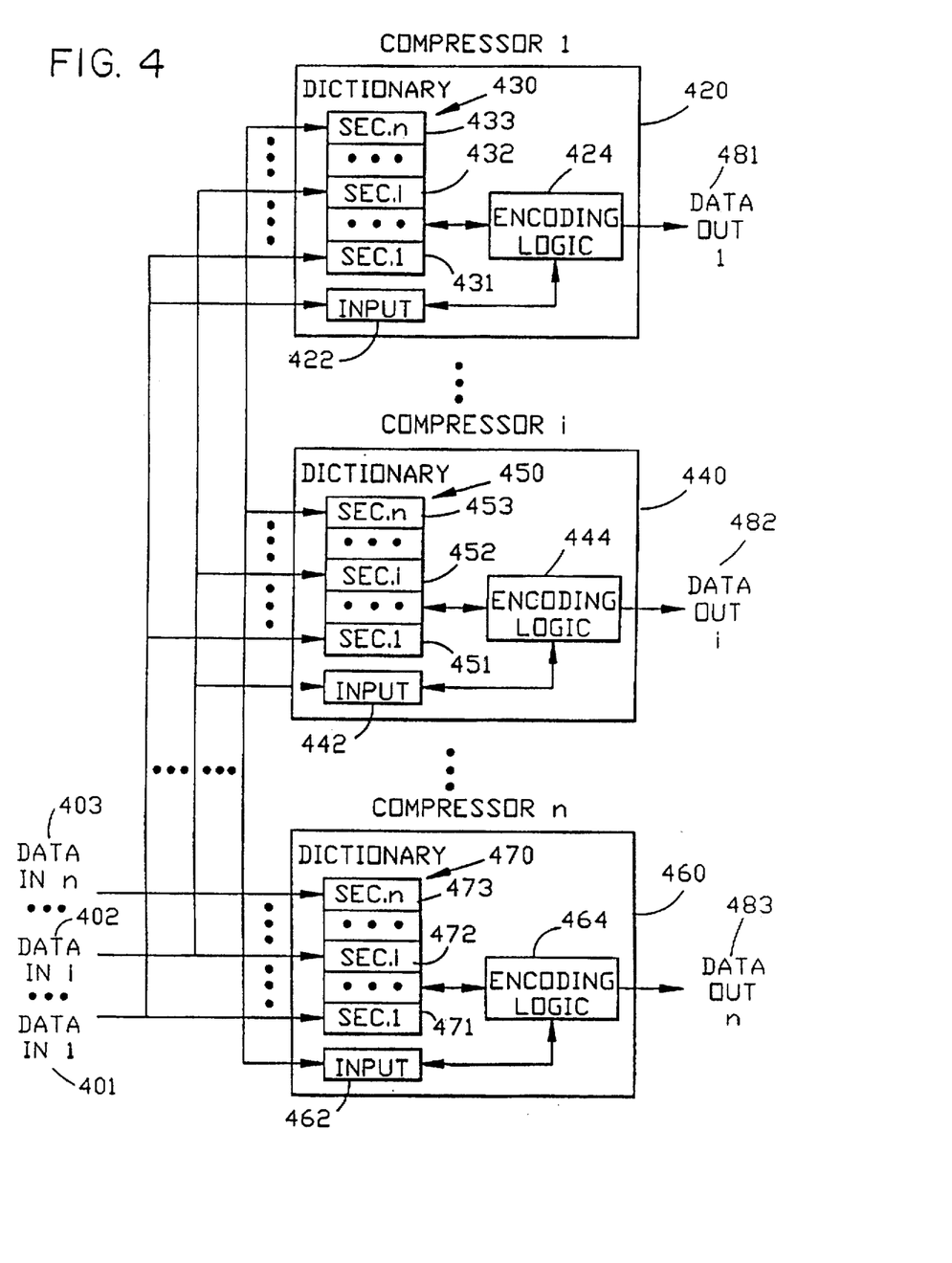
FIG. 4 illustrates an n-way parallel compressor in which a logically sheared dictionary is implemented as n replicated dictionaries.

FIG. 4 illustrates an n-way parallel compressor in which the logically shared dictionary is implemented as n replicated dictionaries. The first compressor 420 uses dictionary 430, the i'th compressor 440 uses dictionary 450, and the n'th compressor 460 uses dictionary 470, where intervening compressors, which are not shown, are implicit. Each dictionary is divided into n equal size sections, where only the first, i'th, and n'th are shown. Dictionary 430 has sections 431, ..., 432, ..., and 433; dictionary 450 has sections 451, ..., 452, ..., and 453; and dictionary 470 has sections 471, ..., 472, ..., and 473. There are n input data streams, each from a sub-block as previously described, where only the first (401), i'th (402), and n'th (403) are shown. The first data input stream 401 is routed to the first section of each dictionary (431, 451, and 471), the n'th data input stream 403 is routed to the last section of each dictionary (433, 453, and 473), and in general the i'th data input stream 402 is routed to i'th section of each dictionary (432, 452, and 472).

Each compressor has an input register (422, 442, and 462). Since the first compressor is compressing the first data input stream 401, input data 422 for compressor 420 is taken from 401; similarly input data 442 for compressor 440 is taken from 402; and input data 462 for compressor 460 is taken from 403.

Using successive values of the input register and the current contents of the dictionary, each compressor uses encoding logic (424, 444, and 464) to produce compressed output data streams 481, 482, and 483.

Figure 5:
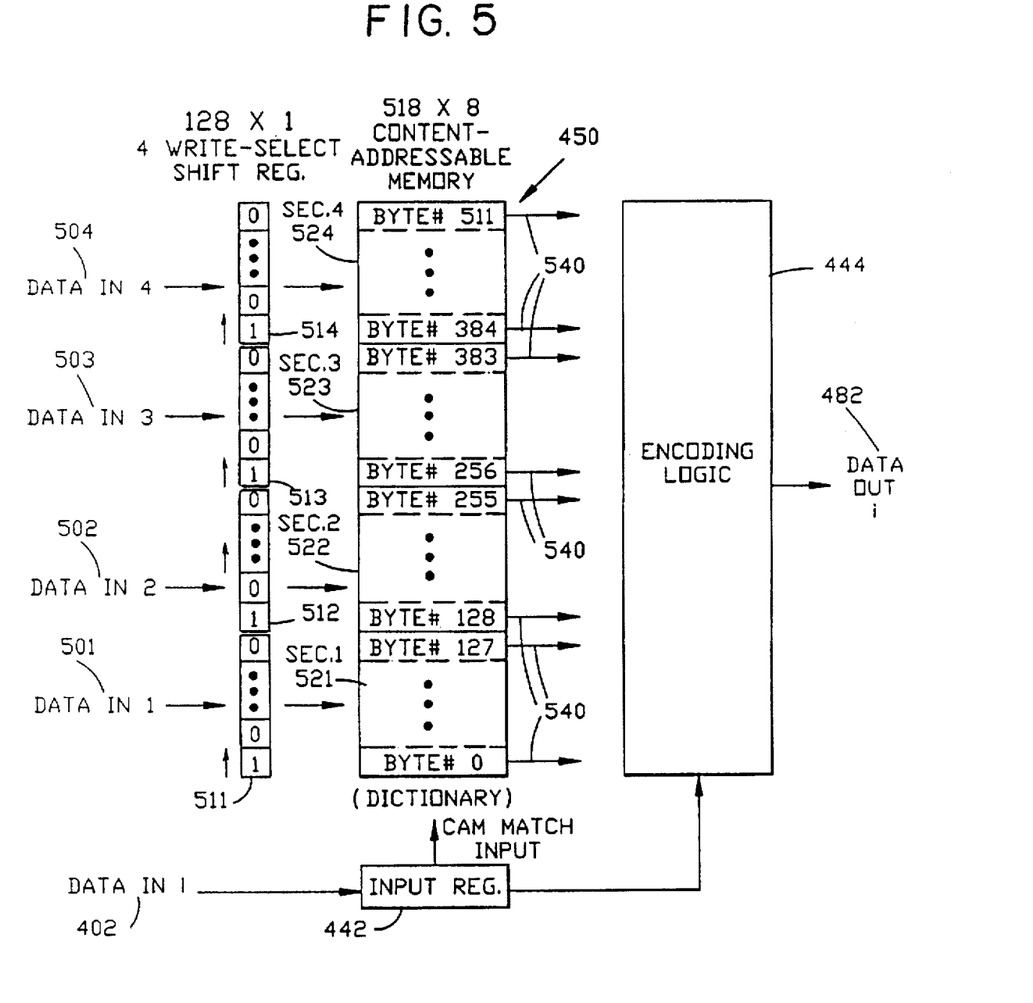
FIG. 5 illustrates an embodiment of the i'th compressor of FIG. 4.

FIG. 5 illustrates an embodiment of the i'th compressor as previously shown in less detail in FIG. 4. For concreteness, the case n=4 is assumed; furthermore it is assumed that the block size is 512. The dictionary 450 is implemented as a 512×8 content-addressable-memory (CAM) divided into four 128-byte sections 521, 522, 523, and 524. Content-addressable-memories are also commonly known in the art as associative memories. Four 128×1-bit shift registers 511, 512, 513, and 514 are used to select write locations to the dictionary for each subsequent byte from the four data input streams 501, 502, 503, and 504. Thus, the first bytes from each of the four input streams are written to CAM locations 0, 128, 256, and 384, respectively; the second bytes from each of the four input streams are written to CAM locations 1, 129, 257, and 385, respectively; and so on. Successive bytes from the i'th input stream 402 (where i could be 1, 2, 3, or 4) are also read into an input register 442. This input register is used as a match input to the CAM.

The output of the CAM consists of 512×1-bit match outputs 540, one corresponding to each CAM memory location, where the output corresponding to a given location is a "1" if that location contains a byte that is the same as (compares equal to) the CAM match input byte, and "0" otherwise. It is assumed that the timing is such that the input register does not compare equal to any values currently being written to the CAM in the current step.

Using successive values of the input register 442, and the current CAM outputs 540 at each step, encoding logic 444 produces compressed output data 482 as subsequently described.

There are a number of conventional variations of adaptive dictionary-based compression methods. For the purposes of FIG. 6 the approach in which the compressed output consists of either (pointer,length) pairs or uncompressed single characters, distinguished by a flag bit, is used. It should be recognized that it is straightforward to use other variations in the context of the current invention, including those variations in which the output is further compressed by using Huffman coding, for example.

Figure 6:
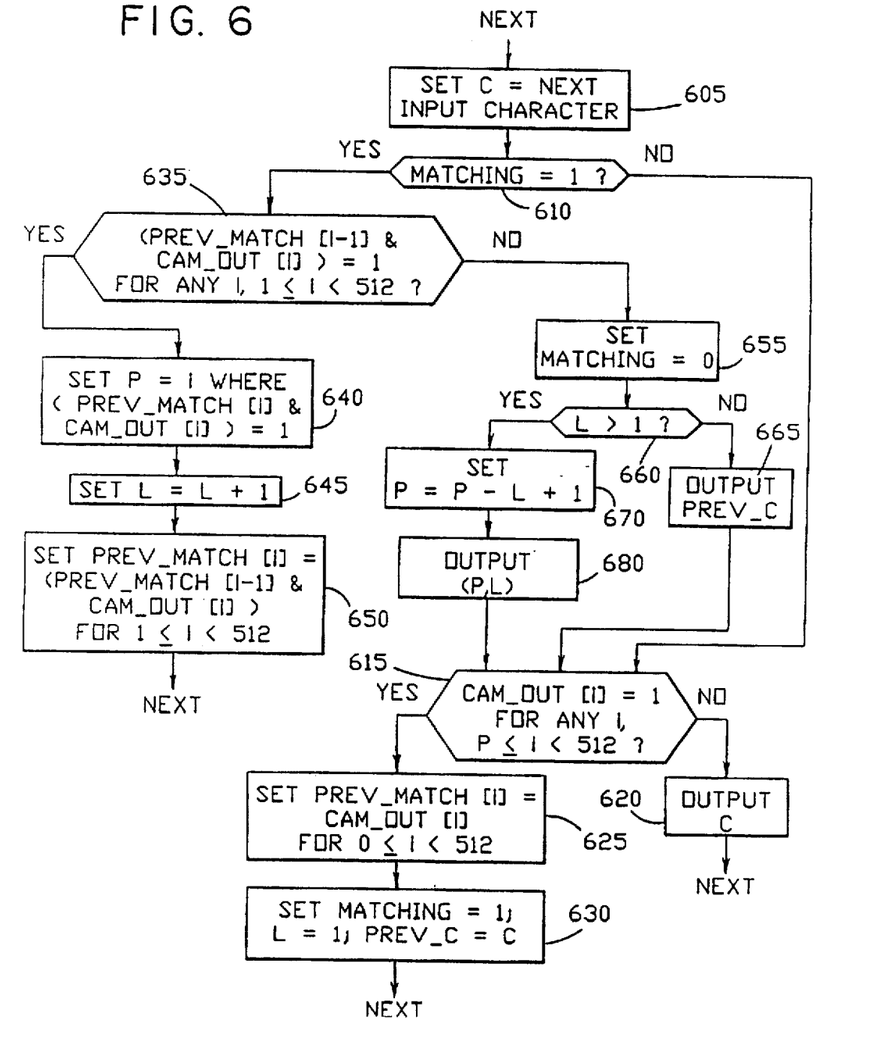
FIG. 6 illustrates encoding logic suitable for use with the compressor of FIG. 4.

The encoding logic is shown in more detail in FIG. 6. The encoding logic uses a binary variable MATCHING, initially 0 (off), to determine whether a match is currently in progress, and which could be implemented as a single-bit register in hardware. In step 605, the next input character is stored in C. Next, in step 610, if MATCHING is on (MATCHING=1) control proceeds to step 635, otherwise control proceeds to step 615.

In step 615 it is determined if any of the CAM outputs (540 in FIG. 5) are on (in hardware this can be done by ORing all CAM outputs); if so control proceeds to step 625 where the CAM outputs are saved in the array PREV_MATCH (which can be implemented as a 512×1 bit memory in hardware). Next, in step 630, MATCHING is set on, the match length counter L is initialized to one, the current input character is saved in PREV_C, and control returns to step 605.

If in step 615 all CAM outputs were off, then in step 620 the current input character C is output in uncompressed form (using a flag bit as described earlier), and control returns to step 605.

Returning to step 610, if MATCHING is on, then control proceeds to step 635. In step 635 it is determined if there is some value of i such that the i'th CAM output and PREV_MATCH[i−1] are both on. In hardware, if PREV_MATCH is implemented as a 512×1 bit memory, this can be determined using combinatorial logic by ANDing the appropriate CAM and PREV_MATCH output bits, and then ORing the result of all such AND gate outputs. If there is such a value of i, this indicates that a subsequent matching character was found in one or more of the matches currently in progress, and control proceeds to step 640, where i is saved in P (if there is more than one such value of i, any can be used in this step). Next, since the length of the current match has been extended by one character, in step 645 the match length counter is incremented. Next, in step 650, the result of ANDing each i'th CAM output with PREV_MATCH[i-1] is saved in PREV_MATCH[i], and control returns to step 605.

If in step 635 it is determined that there was no subsequent matching character, control proceeds to step 655, where MATCHING is cleared. Next, in step 660, it is determined if the match that was found was longer than a single character. If so P is adjusted in step 670 so as to point to the beginning of the phrase, and then in step 680 the (pointer, length) pair (P,L) is output. If, however, the match was a single character long, the character that began the match, which was saved in PREV_C, is output in uncompressed form in step 665. In either case control proceeds to step 615, where as previously described it is determined if there are any matches for the current input character C that can be used to begin a new match.

For simplicity, termination control is not shown in the figure. When the last byte of the sub-block has been processed, then if MATCHING is off, encoding is complete. Otherwise, there was a match in progress when the sub-block ended, and control goes to step 660. Starting from step 660, either a (pointer,length) pair is output in step 680, or a single character is output in step 665, after which encoding is complete.

Figure 7:
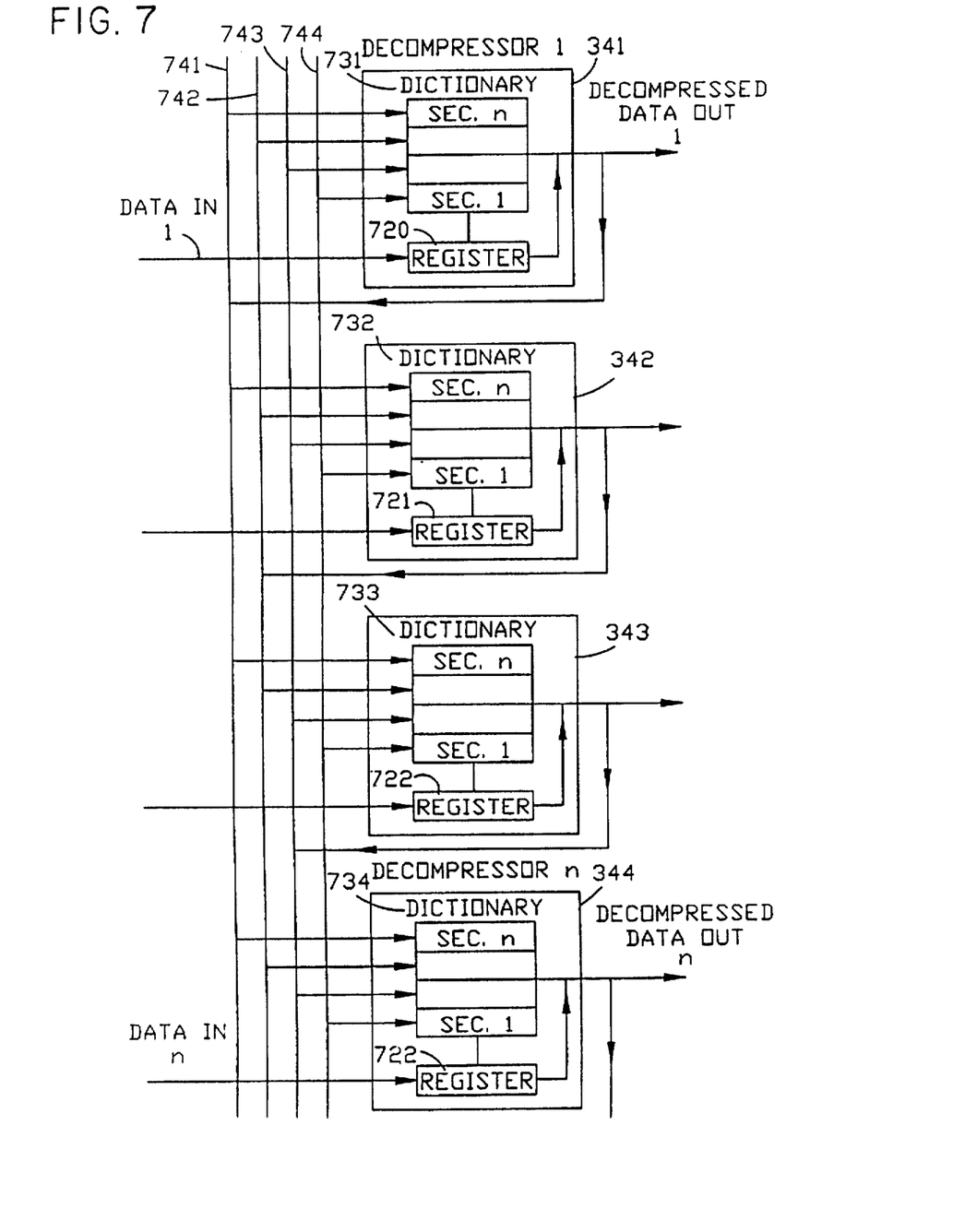
FIG. 7 is an illustration of a 4-way parallel decompression system.

A 4-way parallel decompression system is illustrated in FIG. 7. As in the case of the compressor, we assume that the uncompressed block size is 512 bytes, which is divided into four sub-blocks of uncompressed size 128 bytes. The compressed block is split into 4 sections by the splitter 330 as shown in FIG. 3. Each of these sections is fed into a decompressor. The set of 4 decompressors 341, 342, 343 and 344 are each fed with the output of the splitter 330. Each decompressor has an internal dictionary 731, 732, 733 and 734, which are internal copies of the same dictionary (the logically shared dictionary 345 of FIG. 3). Each dictionary consists of four parts which store the sub-blocks of the decompressed data that has been decoded so far.

Figure 8:
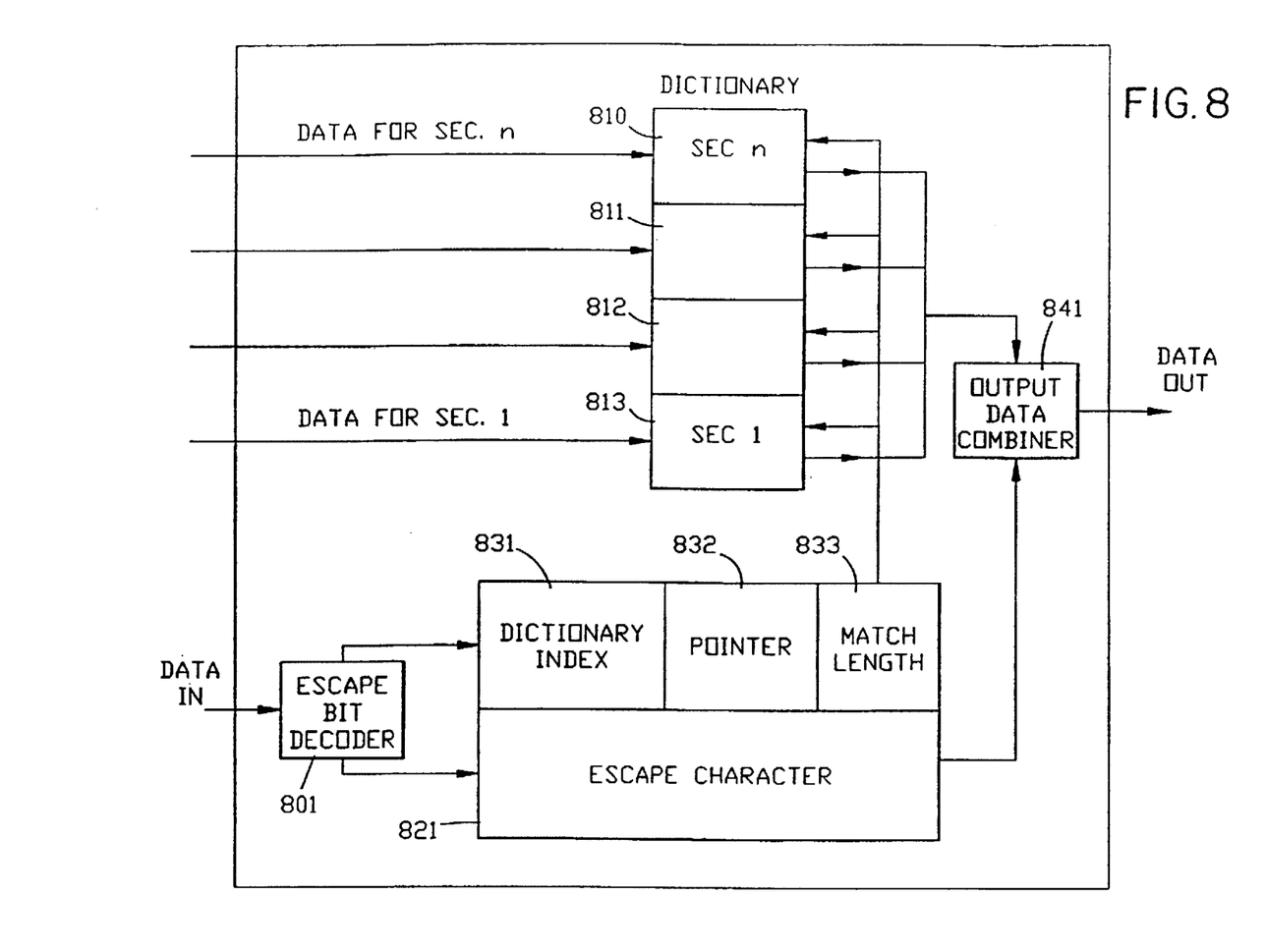
FIG. 8 shows a single decompression block from FIG. 7.

These compressed sub-blocks are parsed into tokens, where each token corresponds to a phrase in the compression algorithm. These tokens are fed into the internal registers 720, 721, 722, 723 and are used to decode the next phrase. The details of the decompression are illustrated in FIG. 8. After a byte is decoded, it is sent to the output, and it is also broadcast to the other decompressors, which then update the corresponding sections of their dictionaries. The output of each decompressor is broadcast over the corresponding buses 741, 742, 743, 744 so that all the decompressors can update the corresponding portions of their dictionaries.

A single decompressor block from FIG. 7 is illustrated in FIG. 8. The block contains a sequence of memories which forms the dictionary. The dictionary, which is divided into four sections 810, 811, 812, 813 of length 128 bytes each. The compressed data is fed into an escape bit decoder 801 which looks at the first bit of the input, and if the first bit is a 0, reads the next 8 bits and puts into the escape character register 821, from which the byte is copied to the output. If the first bit of the input is 1, then the escape bit decoder reads then next 2 bits and puts in the dictionary register 831, then the next 7 bits and puts it in the pointer register 832 and then the next 5 bits and puts in the match length register 833. The decompressor then looks up the location that is pointed to by the dictionary register 831 and the pointer register 832 and copies it to the output data combiner 841. It then decrements the match length pointer by 1 and compares the result with 0. If the result is greater than 0, it then increments the pointer by 1 and copies the character at the new location to the output data combiner 841, and then loops back to the previous step. If the length pointer is equal to 0, it gets out of the loop, and starts decoding the next phrases by sending the next bit of the input to the escape bit decoder.

Figure 9:
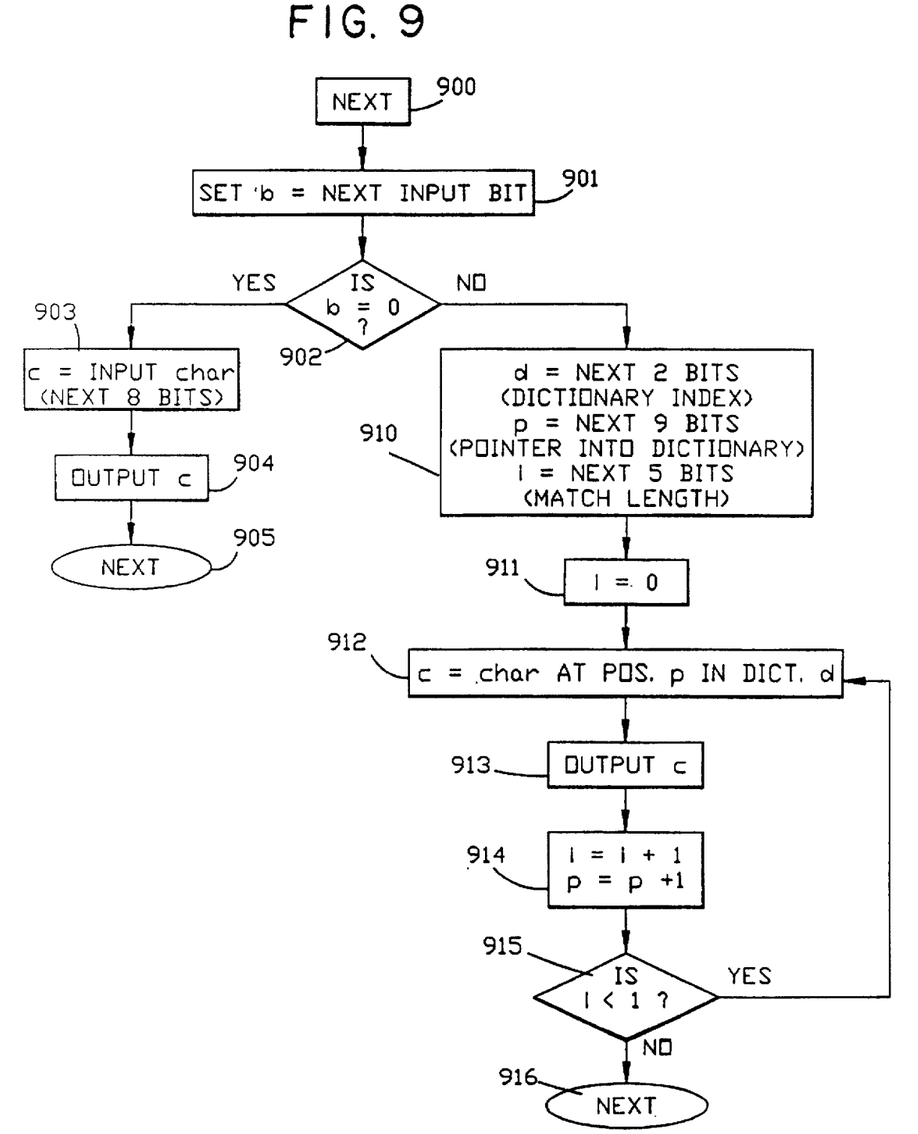
FIG. 9 shows decoding logic suitable for use in conjunction with the system of FIG. 7.

Decoding Logic is shown in FIG. 9. The decompressor looks at the first bit of the input (step 901), and if the first bit (the flag bit) is a 0 (step 902), it reads the next 8 bits and copies it to c 903. The char c is copied to the output (step 904), and the decompressor examines the next bit of the input. If the first bit of the input is 1 (step 902), then the escape bit decoder reads then next 2 bits and puts in the d register (step 910), then the next 7 bits and puts it in the p register (step 910) and then the next 5 bits and puts in the l register (910). It sets i=1. The decompressor then looks up the location that is pointed to by the dictionary and the p registers (step 912) and copies it to the output 913. It then increments the i register by 1 and the p register by 1 (step 914) and compares the result with the l register. If the i register is less than 1 (step 915), it loops back to the previous step (912). Otherwise, it gets out of the loop (step 916), and starts decoding the next phrase by sending the next bit of the input to the escape bit decoder (step 900).

Figure 10:
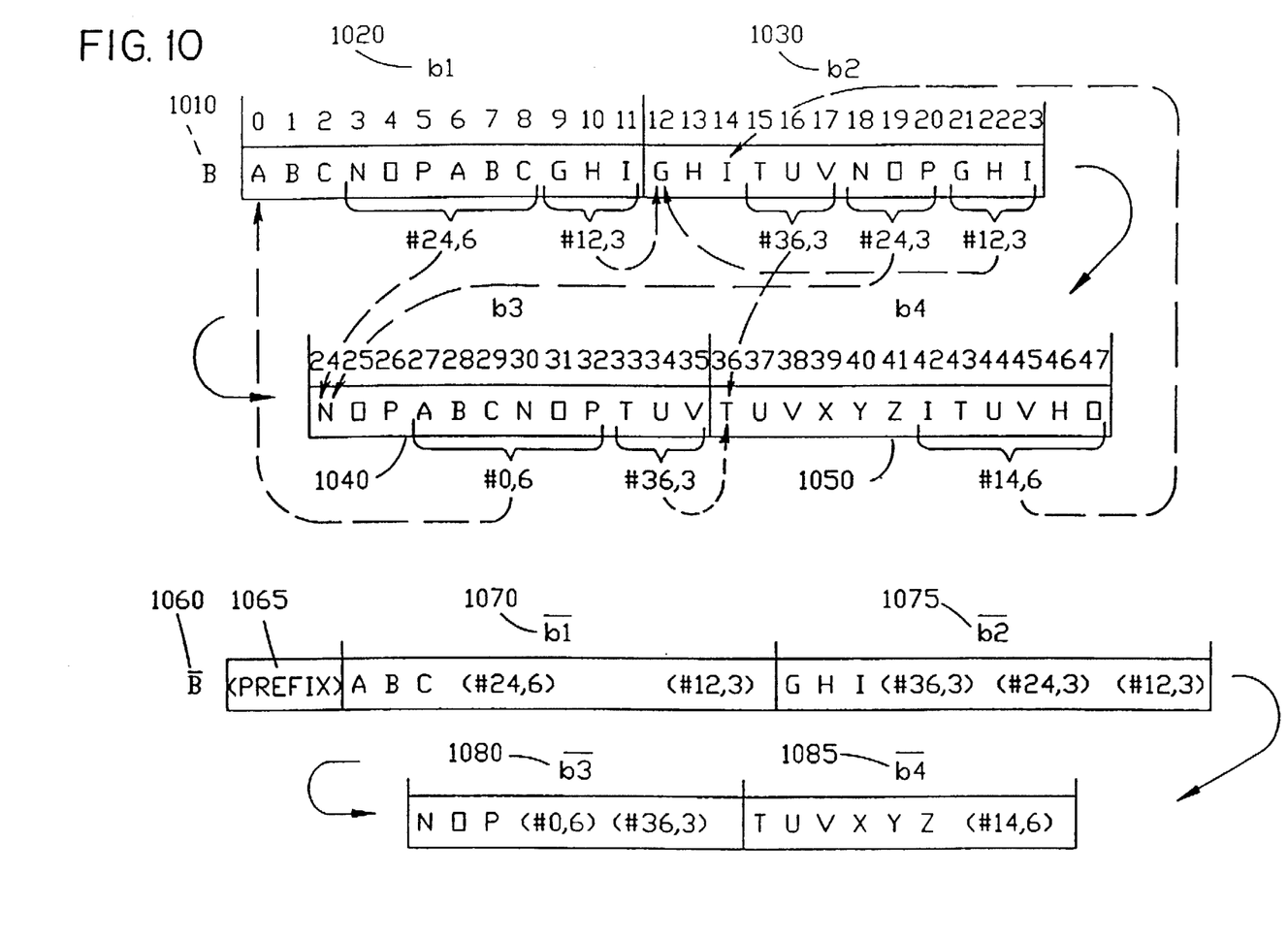
FIG. 10 illustrates, using an example of the contents of an uncompressed block, pointer structures that can be produced by the present compression system.

FIG. 10 illustrates, using an example of the contents of an uncompressed block B 1010, the pointer structures that can result when using the present compression system. For the purposes of this example it is assumed that the block size is 48 bytes, and that n=4, so that B is divided into four equal size sections b1 1020, b2 1030, b3 1040, and b4 1050 consisting of 12 bytes each.

Note that if this block were compressed sequentially using typical prior-art adaptive dictionary-based compression methods, the pointer component of all (pointer,length) pairs would be a "backwards" pointer, that is a pointer to some earlier location. However, using the current invention, "forward" pointers result whenever data in a sub-block bi is compressed using the current dictionary for sub-block bj in the case that i<j. Referring to FIG. 10, some examples of forward pointers in the compressed output correspond to the string 'NOPABC' starting at byte #3 which is compressed to (#24,6) (where "#x" is used to indicate a pointer to location x); the string 'GHI' starting at byte #9 which is compressed to (#12,3), the string 'TUV' starting at byte #15 which is compressed to (#36,3), and so on.

Using this notation, the compressed block B 1060 is shown in the figure with a prefix area 1065 as previously described, followed by compressed sub-blocks b1 1070, b2 1075, b3 1080, and b4 1085.

Figure 11:
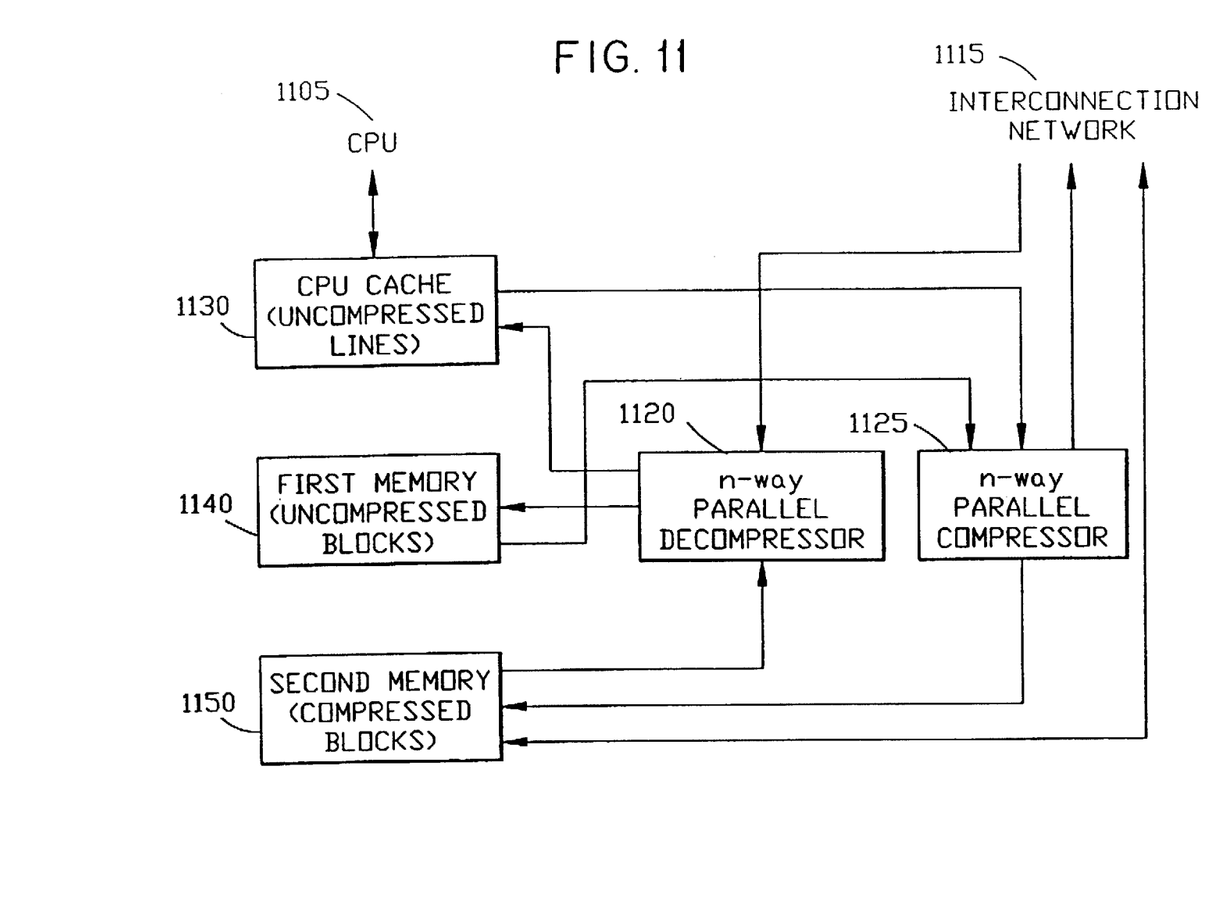
FIG. 11 illustrates how an n-way parallel decompressor and an n-way parallel compressor can be used in a computer system

FIG. 11 illustrates how an n-way parallel decompressor 1120 and an n-way parallel compressor 1125 could be used in a computer system consisting of a CPU 1105, a cache memory 1130 for the CPU which contains cache lines in uncompressed format, a first main memory 1140 which contains blocks in uncompressed format, and a second memory 1150, which could be used as an extension to the first memory, and which contains blocks in compressed format. Additionally, this computer system could be one node of a multicomputer system in which messages are exchanged and data is shared by means of an interconnection network 1115.

As shown in the figure, CPU cache 1130 misses can be handled by transfer of the relevant data from the first memory 1140 as is typical in current systems; furthermore, a cache miss could also be handled by de-compressing the relevant data stored in the second memory 1150 by means of the de-compressor 1120 and then transferring the relevant data to the cache 1130 (and optionally also to the first memory 1140). Similarly, cache write-throughs could take place to the first memory 1140 as is typical in current systems; additionally, a write-through could take place to the second memory 1150 by means of the compressor 1125. Data can also be moved, for memory management purposes, between the first memory 1140 and second memory 1150 by means of compression and decompression using the compressor 1125 and de-compressor 1120, under program control.

In the case that the computer system is one node of a multicomputer system, the effective bandwidth for internode transfer of messages and data blocks can be increased in the case that data is transferred in a compressed format. For this purpose data transfers could take place directly to or from the second memory 1150 via the interconnection network 1115. Additionally, data could be transferred to or from the first memory 1140 via the interconnection network 1115 by de-compressing or compressing, respectively, using the de-compressor 1120 or the compressor 1125.

Now that the invention has been described by way of the preferred embodiment, various modifications and improvements will occur to those of skill in the art. Thus, it should be understood that the preferred embodiment has been provided as an example and not as a limitation. The scope of the invention is defined by the appended claims.

We claim:

1. An apparatus for compressing a block of data, the apparatus comprising:
   a splitter having an input configured to receive the block of data dividing the block of data and having an output providing sub-blocks formed from the block of data;
   a plurality of compression engines configured to cooperatively construct a dynamic compression dictionary, wherein at least one sub-block is used in the compression of another sub-block; and,
   a concatenator coupled to outputs of the compression engines, and having an output providing a compressed block as formed as a concatenation of compressed sub-blocks produced by the compression engines.

2. The apparatus of claim 1 further comprising: a router coupled to the splitter to receive the sub-blocks and connected to the compression engines to provide selected ones of the sub-blocks to respective ones of the compression engines.

3. The apparatus of claim 1 wherein the compression engines include means for substituting for phrases in the sub-blocks, pointers to a common dictionary including a plurality of subdictionaries, each of the subdictionaries including entries indicative of portions of the sub-blocks which have already been compressed.

4. The apparatus of claim 1 wherein the compressed block includes pointers to entries in the dictionary.

5. The apparatus of claim 1 further comprising an associative memory for storing the dictionary.

6. The apparatus of claim 1 wherein the dictionary comprises a plurality of physically distinct but logically shared dictionaries.

7. A method for compressing a block of data, comprising the steps of:
   dividing the block of data into sub-blocks;
   providing each of the sub-blocks to a respective compressor in a plurality of compressors;
   cooperatively constructing a dynamic compression dictionary by the plurality of compressors, wherein at least one sub-block is used in the compression of another sub-block;
   compressing the sub-blocks using the dynamic compression dictionary; and,
   concatenating outputs of the compressors to form a compressed block.

8. The method of claim 7 wherein the compressing is performed by substituting for phrases in the sub-blocks, pointers to a common dictionary including a plurality of subdictionaries, each of the subdictionaries comprising entries indicative of portions of the sub-blocks which have already been compressed.

9. The method of claim 7 wherein the compressed block includes pointers to entries in the dictionary.

10. A method of decompressing a block of compressed data, comprising the steps of:
    dividing the block of the compressed data into sub-blocks;
    assigning each of the sub-blocks to a respective decompressor in a plurality of decompressors;
    cooperatively constructing a dynamic decompression dictionary by the plurality of decompressors;
    decompressing the sub-block using the dynamic decompression dictionary, wherein said decompressing uses at least one other sub-block;
    concatenating outputs of the decompressors to form a decompressed block.

11. The method of claim 10 wherein the decompressing is performed by substituting pointers to a common dictionary with phrases, the common dictionary including a plurality of subdictionaries, each of the subdictionaries comprising entries indicative of portions of the sub-blocks which have already been decompressed.

12. The method of claim 10 wherein the compressed block includes control data indicative of the location and extent of each compressed sub-block in the compressed block.

13. A program storage device readable by a machine, tangibly embodying a program of instructions executable by the machine to perform method steps for decompressing a block of data, the method steps comprising:
    dividing the block of the compressed data into sub-blocks;
    assigning each of the sub-blocks to a respective decompressor in a plurality of decompressors;
    cooperatively constructing a dynamic decompression dictionary by the plurality of decompressors;
    decompressing the sub-blocks using the dynamic decompression dictionary, wherein said decompressing uses at least one other sub-block;
    concatenating outputs of the decompressors to form a decompressed block.

14. The program storage device of claim 13 wherein the decompressing is performed by substituting pointers to a common dictionary with phrases, the common dictionary including a plurality of subdictionaries, each of the subdictionaries comprising entries indicative of portions of the sub-locks which have already been decompressed.

15. A method for compressing data, comprising the steps of:
    providing multiple data streams to a plurality of compressors which can operate in parallel;

cooperatively constructing a dynamic compression dictionary by the plurality of compressors; and, compressing the data streams using the dynamic compression dictionary, wherein data from at least one data stream is used in the compression of data from another data stream.

16. A program storage device readable by a machine, tangibly embodying a program of instructions executable by the machine to perform method steps for compressing a block of data, the method steps comprising:

dividing the block of data into sub-blocks;

providing each of the sub-blocks to a respective compressor in a plurality of compressors;

cooperatively constructing a dynamic compression dictionary by the plurality of compressors;

compressing the sub-blocks using the dynamic compression dictionary, wherein at least one sub-block is used in the compression of another sub-block; and, concatenating outputs of the compressors to form a compressed block.

17. A computer readable memory that can be used to direct a computer to compress a block of data when used by the computer, comprising:

means for distributing portions of the block of data among a plurality of compressors which can operate in parallel;

means for causing the compressors to cooperatively construct a dynamic compression dictionary and to compress the block of data using the dynamic compression dictionary, wherein at least one sub-block is used in the compression of another sub-block.

18. A computer readable memory that can be used to direct a computer to decompress a block of data when used by the computer, comprising:

means for dividing the block of the compressed data into sub-blocks;

means for assigning each of the sub-blocks to a respective decompressor in a plurality of decompressors;

means for causing the plurality of decompressors to cooperatively construct a dynamic decompression dictionary and to decompress the sub-blocks using the dynamic decompression dictionary wherein said decompressing uses at least one other sub-block; and means for concatenating outputs of the decompressors to form a decompressed block.

19. A data structure instantiated in a computer readable memory, comprising:

a block of compressed data corresponding to an original block of uncompressed data, wherein the block of compressed data includes pointers to entries in the original block of uncompressed data and wherein at least some of the pointers point forward and at least some of the pointers point backward relative to an actual position of a given compressed phrase in the original block.

20. A method of data compression where a set of at least two compressors operating in parallel, each on a possibly distinct data stream, cooperate in constructing a dictionary to be used in compression, so that decompression of each output stream produced by a compressor accesses at least one other output stream produced by the set.

21. A method of data compression using multiple compressors operating in parallel, or possibly distinct data streams, where each compressor operates by sending pointers to phrases seen earlier with data streams, or in the data streams of the other compressors.

22. A method for decompressing data, comprising the steps of:

providing multiple data streams to a plurality of decompressors which can operate in parallel;

cooperatively constructing a dynamic decompression dictionary by the plurality of decompressors; and, decompressing the data streams using the dynamic decompression dictionary, wherein data from at least one data stream is used in the compression of data from another data stream.

* * * * *